(12) United States Patent
Check et al.

(10) Patent No.: US 8,242,603 B2
(45) Date of Patent: Aug. 14, 2012

(54) CHIP IDENTIFICATION USING TOP METAL LAYER

(75) Inventors: Joseph J. Check, Allentown, PA (US);
Edward B. Harris, Fogelsville, PA (US); Lyle K. Mantz, II, Summit Hill, PA (US); Richard R. Kiser, Breinigsville, PA (US); Patricia J. Leith, Stroudsburg, PA (US)

(73) Assignee: Agere Systems Inc., Allentown, PA (US)

( * ) Notice: Subject to any disclaimer, the term of this patent is extended or adjusted under 35 U.S.C. 154(b) by 148 days.

(21) Appl. No.: 12/741,839

(22) PCT Filed: Dec. 10, 2007

(86) PCT No.: PCT/US2007/086946
§ 371 (c)(1),
(2), (4) Date: Jul. 8, 2010

(87) PCT Pub. No.: WO2009/075675
PCT Pub. Date: Jun. 18, 2009

(65) Prior Publication Data
US 2010/0270684 A1    Oct. 28, 2010

(51) Int. Cl.
*H01L 23/48* (2006.01)
*H01L 23/52* (2006.01)
*H01L 29/40* (2006.01)

(52) U.S. Cl. ........ 257/773; 257/774; 257/781; 257/786; 257/E21.536; 257/E23.179; 438/612; 438/669

(58) Field of Classification Search .................. 700/116, 700/121; 257/48, 780–782, 784, 786, E21.613, 257/773, 774, E21.536, E23.179; 438/612, 438/669
See application file for complete search history.

(56) References Cited

U.S. PATENT DOCUMENTS

| | | | |
|---|---|---|---|
| 5,128,737 A * | 7/1992 | van der Have | ............... 257/503 |
| 6,097,098 A | 8/2000 | Ball | |
| 6,423,908 B1 | 7/2002 | Liu | |
| 6,952,623 B2 | 10/2005 | McAdams et al. | |
| 2002/0074666 A1 * | 6/2002 | Usami | ........................... 257/774 |

OTHER PUBLICATIONS

PCT International Search Report and the Written Opinion dated May 23, 2008, for International Application No. PCT/US07/86946.

* cited by examiner

*Primary Examiner* — Jasmine Clark
(74) *Attorney, Agent, or Firm* — Mendelsohn, Drucker & Associates, P.C.; David L. Cargille; Steve Mendelsohn

(57) ABSTRACT

An integrated circuit (IC) structure includes a semiconductor substrate having a plurality of memory bits including IC identification information and a plurality of alternating metal and via layers thereabove. The IC structure includes a bond pad layer formed over a top one of the metal layers. The bond pad layer includes a plurality of pins connected to respective ones of the plurality of memory bits through the metal and via layers, at least one first pad connected to a higher voltage power supply rail and at least one second pad is connected to a lower voltage power supply rail. The bond pad layer has a plurality of circuit segments therein that each connects a respective one of the plurality of pins to either the at least one first pad or the at least one second pad for programming the IC identification information into the memory bit corresponding to that pin.

20 Claims, 6 Drawing Sheets

PIN TO CIRCUITRY

CHIP IDENTIFICATION USING TOP METAL LAYER

FIELD OF THE INVENTION

The present invention relates to integrated circuit (IC) structures and methods of making the same, and more particularly to IC structures having identification and other product information provided therein.

BACKGROUND

Many integrated circuits have chip function identification codes programmed into the chip. The identification codes often take the form of thirty-two (32) bit codes that are programmed into the chip's circuitry by selective connection of individual pins within the IC to VSS or VDD to represent data "0" or "1", respectively. The pins are connected to internal data circuitry, such as a register, formed in the substrate that can be accessed to read the 32 bit code programmed into the chip. In these prior art chips, each bit design has a horizontal strap with contacts and links on all metal levels. Each strap represents one metal level where the links can be removed and added depending on the setting of the bit to VDD (high) or VSS (low).

FIG. 1 is a top view of a chip having a chip function identification layout using links within the metal layers for Bit 31 through Bit 0. All metal layers are shown. The area assigned to one bit is labeled as such in FIG. 1. FIG. 2 is an enlarged view of the bit area shown in FIG. 1. The VSS and VDD rails are labeled as such. FIG. 3 is a cross-sectional representation of one bit area. FIG. 3 shows a pin formed at Metal 3 that is connected by a circuit path (not shown) to substrate circuitry (e.g., a register) (also not shown). FIG. 3 also illustrates Metal and Via layers 1 to 7. Metal links 10 shown in FIG. 3 are selectively provided or not provided on a specific metal level in order to set the bit of the chip ID to either LOW/VSS or HIGH/VDD, i.e., to selectively connect the pin for that bit to VSS or VDD. Setting the links 10 in this design is complex, since the designer must be sure to add and remove the correct metal link in the correct horizontal strap. Further, as new versions of the chip are released, new chip function identification codes are assigned to the new versions. Since the codes are programmed into the chip using links 10 within the various metal connection layers, a new mask or masks (in some circumstances) is required to incorporate the change in links needed to change the programmed bits of the code. This is required even if the change in chip functionality did not necessitate a change to the structure of the metal/via connection layers. As those in the art will recognize, these metal layer masks are quite expensive, often costing $50,000 or more each, and difficult to design.

New layout structures for programming chip identification function codes and other information are desired.

SUMMARY OF THE INVENTION

An integrated circuit (IC) structure includes a semiconductor substrate having a plurality of memory bits and a plurality of alternating metal layers and via layers thereabove. The memory bits include IC identification information. The IC structure includes a bond pad layer formed over a top one of the metal layers. The bond pad layer includes a plurality of pins connected to respective ones of the plurality of memory bits through the metal and via layers. At least one first pad is connected to a higher voltage power supply rail and at least one second pad is connected to a lower voltage power supply rail. The bond pad layer has a plurality of circuit segments therein where each of the plurality of circuit segments connects a respective one of the plurality of pins to either the at least one first pad or the at least one second pad for programming the IC identification information into the memory bit corresponding to that pin.

A method is also provided. The method includes the steps of providing a semiconductor substrate having a plurality of memory bits and a plurality of alternating metal layers and via layers thereabove, the memory bits including integrated circuit (IC) identification information; forming a bond pad layer over a top one of the metal layers, the bond pad layer including at least one first pad connected to a higher voltage power supply rail and at least one second pad connected to a lower voltage power supply rail; forming, in the bond pad layer, a plurality of pins connected to respective ones of the plurality of memory bits through the metal and via layers; and forming a plurality of circuit segments in the bond pad layer, each of the plurality of circuit segments connecting a respective one of the plurality of pins to either the at least one first pad or the at least one second pad, for programming the IC identification information into the memory bit corresponding to that pin.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
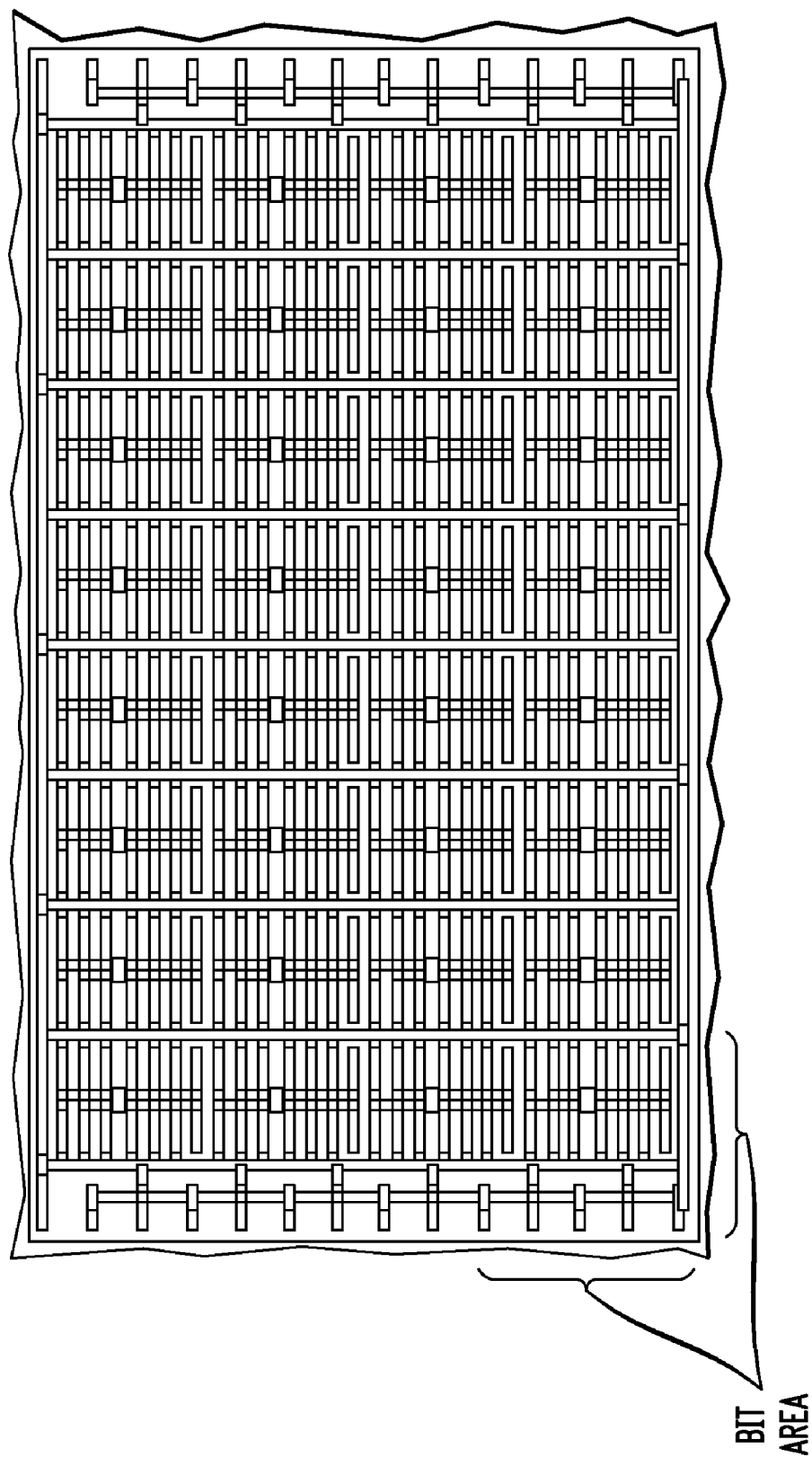
FIG. 1 is a top view of a portion of prior art chip function identification layout using links within the metal layers.
Figure 2:
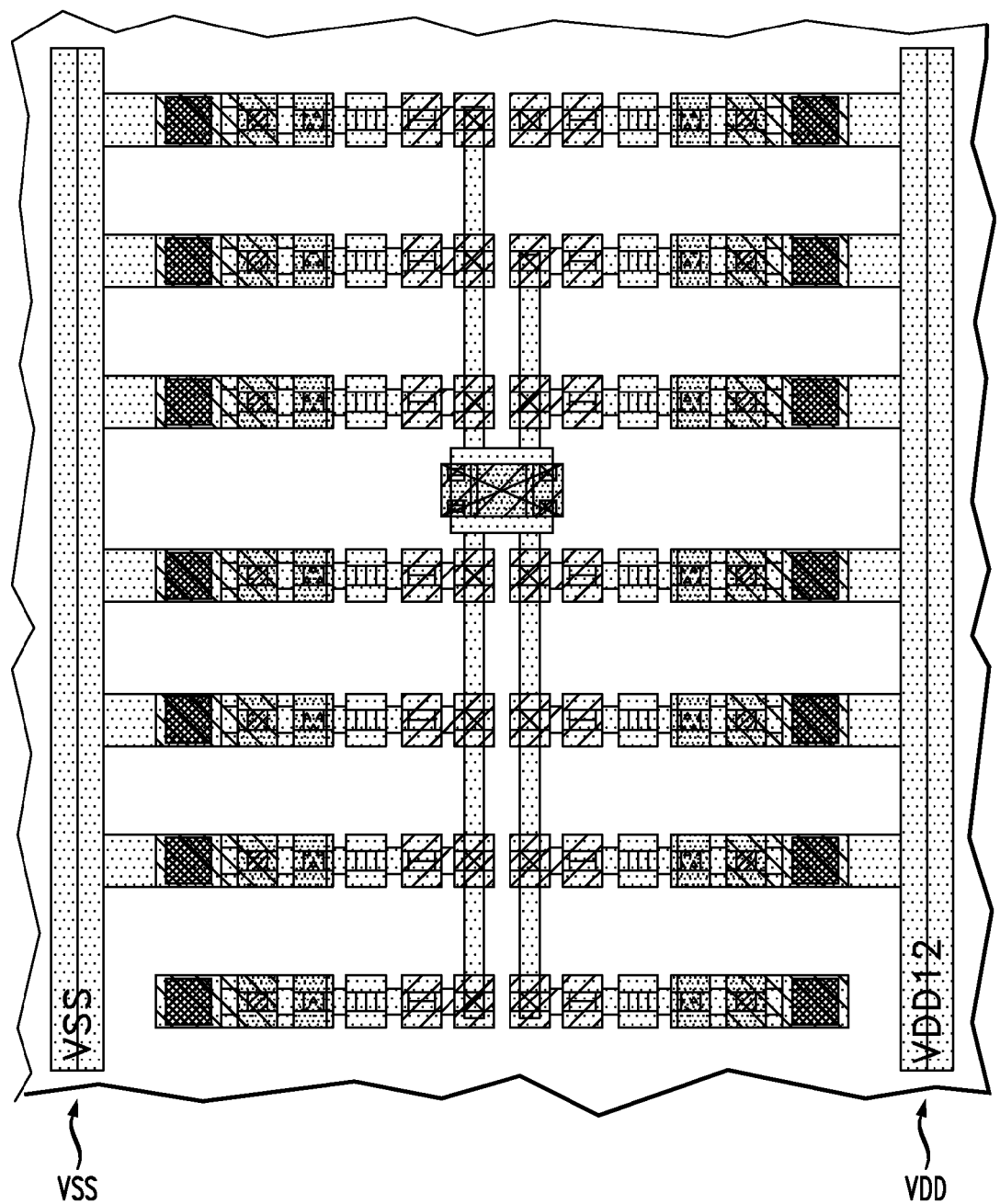
FIG. 2 is an enlarged view of a portion of the layout of FIG. 1.
Figure 3:
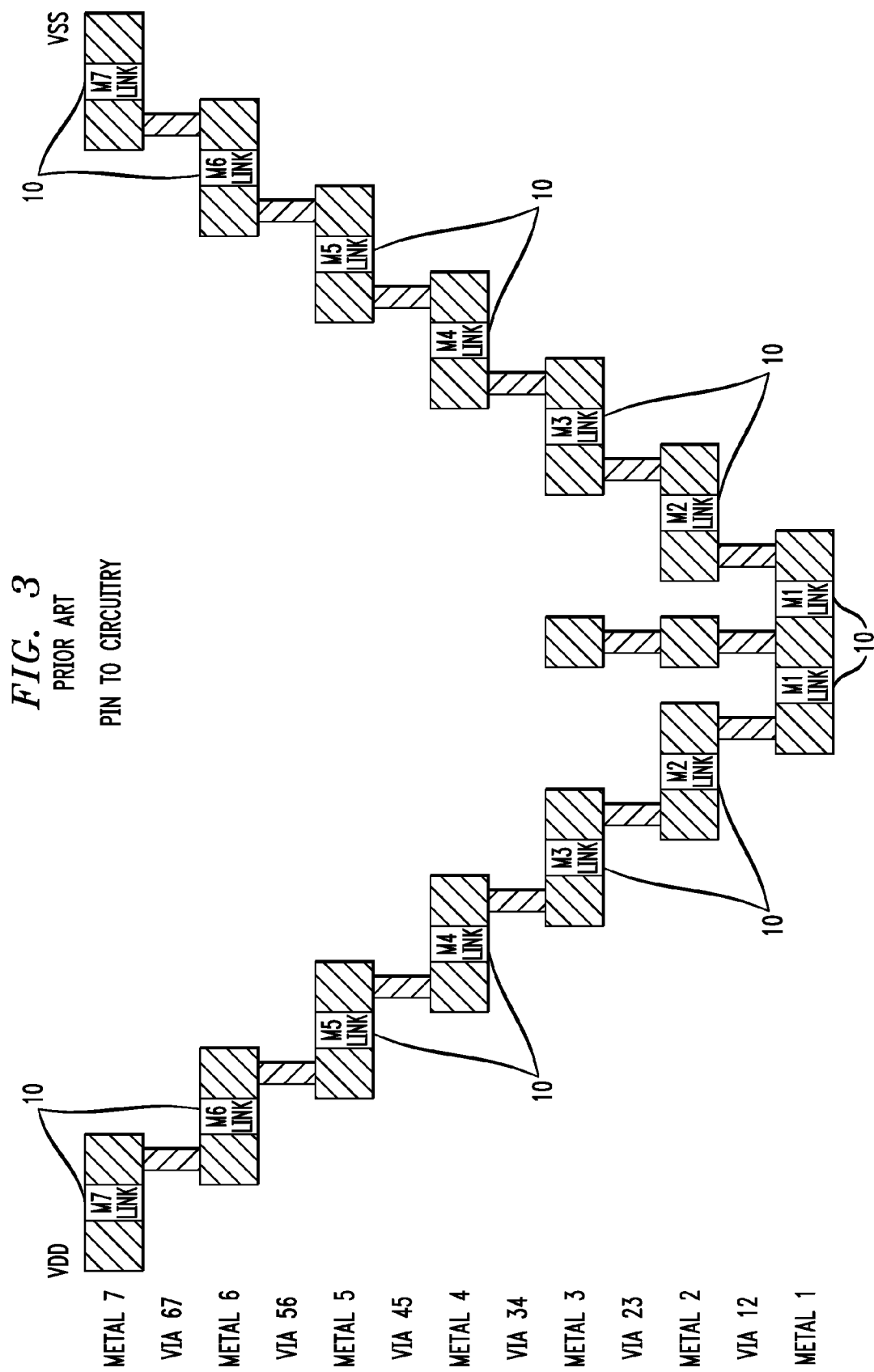
FIG. 3 is a cross-sectional representation of one bit from the layout of FIGS. 1 and 2.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 4:
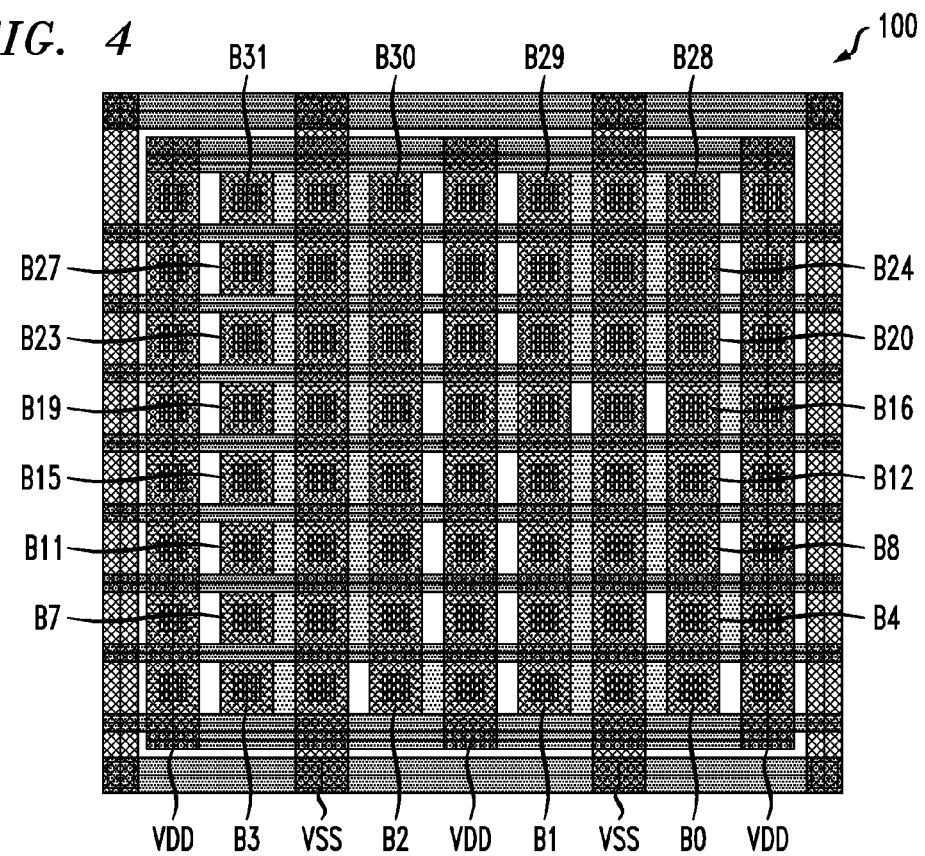
FIG. 4 is a top view of a portion of a chip using the top bond pad layer for programming chip function identification information according an embodiment of the present invention.
Figure 5:
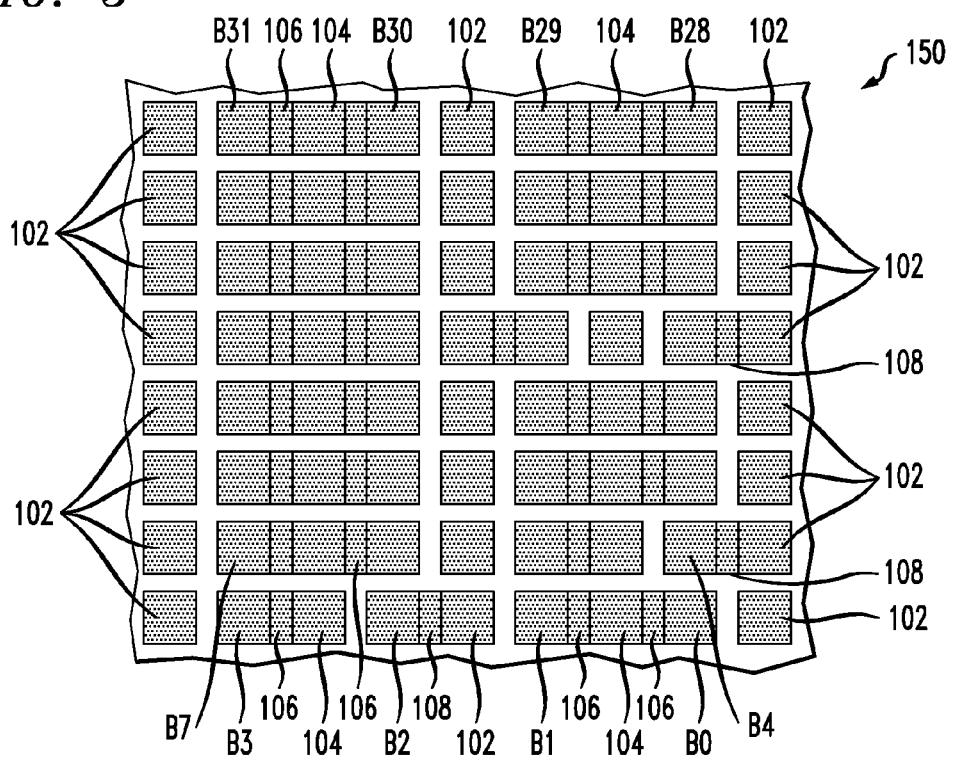
FIG. 5 is a top view of a portion of the top bond pad layer of the chip of FIG. 4.
Figure 6:
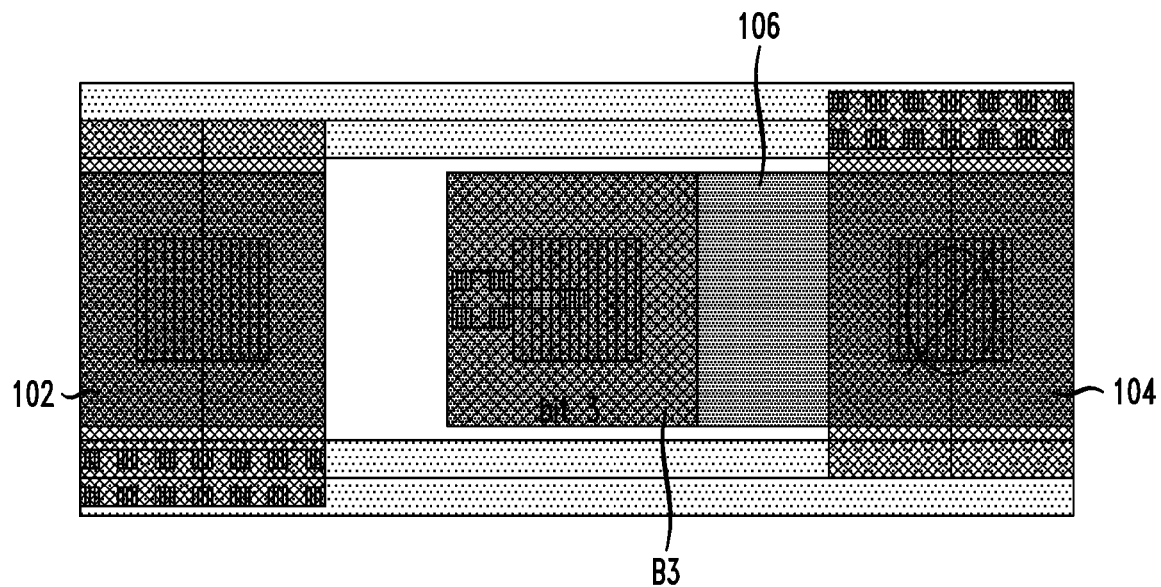
FIG. 6 is an enlarged view of a portion of the top view of FIG. 4.
Figure 7:
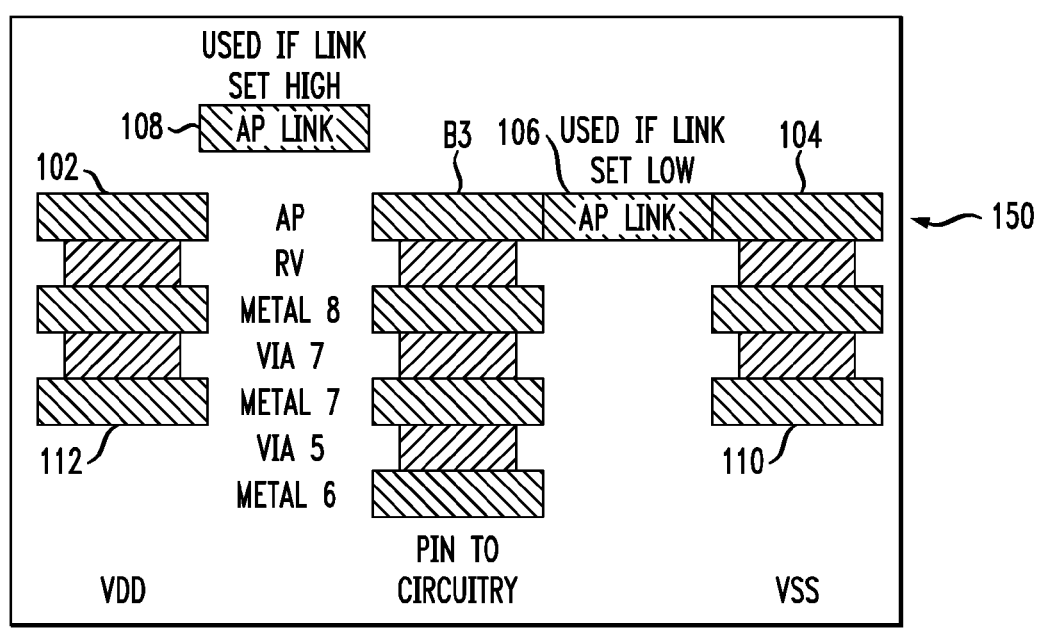
FIG. 7 is a cross-sectional representation of the portion of FIG. 6.

A new method for programming chip identification information into an integrated circuit chip and layout for accommodating this method are described in connection with FIGS. 4-7. Though described in connection with programming chip identification information, it should be appreciated that the method and structure described herein can be used to program any kind of information into a chip. FIG. 4 is a top view of a chip with programming capability in the form of programmable links built into the top aluminum (or other conductive material) bond pad layer rather than the underlying metal interconnection layers as described in the Background section. All mask layers are shown in FIG. 4. As described below, pins are formed within the top bond pad layer and selectively coupled to high or low supply pads to perform programming. FIG. 5 provides a top plan view of the top aluminum bond pad layer. FIG. 6 is an enlarged view of a portion of FIG. 4 focusing on the structure corresponding to one bit. Finally, FIG. 7 is a cross-sectional view of the bit region of FIG. 6 illustrating various layers in the structure for programming the chip identification information into the chip circuitry.

As will be understood by those familiar with chip designs, the chip includes a substrate having a metallization structure formed over the substrate including a plurality of metal layers and interconnecting metal vias between the layers. Circuits are formed within the substrate using known techniques. In embodiments, the substrate includes circuitry for storing, at least while power is supplied to the chip, memory bits. In specific embodiments, these memory bits store chip function identification information. These memory bits can take the form of, for example, a register formed from known transistor structures formed in the substrate. This memory structure, sometimes referred to herein as "circuitry", is coupled to pins for setting the data of the various bits. This data can then be read from the register to read the data out of the chip.

Turning to FIG. 4, a layout 100 is shown for programming 32 bits of chip function identification information into the chip. Individual memory bits are programmed to either high (VDD) or low (VSS) by selectively connecting a corresponding pin formed in the top aluminum bond pad layer (labeled AP in FIG. 7) to either a VDD pad or a VSS pad formed in the AP layer. "AP" stands for "Aluminum for bond pad" and is the top level metal in an IC. As more clearly shown in FIG. 5, the bond pad layer 150 includes VDD pads 102 spaced from one another in a strip pattern and formed in a first line and VSS pads 104 spaced from one another and formed in a second line, which is parallel to and spaced from the first line. In embodiments, the VDD and VSS pads can be continuous strips or spaced pads as shown. Individual pins are formed in the bond pad layer, although only pins B0 to B4, B7-B8, B11-B12, B15-B16, B19-B20, B23-B24, and B27-B31 are labeled in FIG. 4 and only pins B0-B5, B7 and B28-B31 are labeled in FIG. 5. As can be seen from FIG. 5, the pins B0-B31 are also formed in lines, including pins B0, B4, B8, B12, B16, B20, B24 and B28 in a first group, pins B1, B5, B9, B13, B17, B21, B25 and B29 in a second group, pins B2, B6, B10, B14, B18, B22, B26 and B30 in a third group, and pins B3, B7, B11, B15, B19, B23, B27 and B31 in a fourth group. Each line of pins is formed in the bond pad layer adjacent to and in between a line of VDD pads 102 and a line of VSS pads 104.

Links are selectively formed between a given pin and an adjacent VDD pad 102 or VSS pad 104 in order to connect the given pin to either a VDD or VSS pad. As shown in FIG. 5, links 106 are formed to connect a pin, such as pin B0, B1, B3 or B31, to an adjacent respective VSS pad 104. Conversely, links 108 are formed to connect a pin, such as pin B2 or B4 to an adjacent respective VDD pad 102. Not all links 106, 108 or pins B0-B31 are labeled, so as to avoid unnecessary cluttering of the illustration of FIG. 5.

FIG. 6 shows an enlarged top view of a portion of FIG. 4 showing the connection structure for programming Bit 3. As can be seen in FIG. 6, the pin B3 formed in the bond pad layer is connected to a corresponding VSS pad 104 by a link 106 formed in the bond pad layer. No link 108 is provided. Therefore, pin B3 is set to VSS (i.e., low) when the chip is powered on.

FIG. 7 is a cross-sectional view of the connection structure for programming a bit. Metal and via layers 6, 7 and 8 are shown in the cross sectional view. Higher power supply rail (VDD) 112 is provided at Metal 7 and lower power supply rail (VSS) 110 is also provided at Metal 7. It should be understood that the VSS and VDD rails are shown at Metal 7 merely for illustrative purposes and these rails can be formed at other metal layers as desired. These rails are connected through layers Via 7 and Metal 8 to the redistribution via (RV) layer to connect to VDD pad 102 and VSS pad 104 formed in the bond pad layer (labeled "AP"). As can be seen in the cross section, VSS pad 104 is connected to pin B3 via an AP link 106 formed therebetween. For illustrative purposes only, FIG. 7 shows that an AP link 108 would be formed between VDD pad 102 and pin B3 if it were desired to alternatively connect pin B3 to VDD pad 102. In such an embodiment, AP link 106 would not be provided. Pin B3 is connected in a vertical line through RV, Metal 8, Via 7, Metal 7, Via 6 to Metal 6. Metal 6 is coupled by means of a circuit path through the metallization structure (not shown) to memory circuitry (e.g., registry circuitry) formed in the substrate of the chip. Those of ordinary skill in the art will understand that the circuit path to the substrate through the metal layers overlying the substrate can be designed in any number of ways. As illustrated, the connection structure between the pin B3 and an intermediate metal level (e.g., Metal 6) is purely vertical.

As described above, the selective programming of a bit to HIGH or LOW is accomplished in the bond pad layer formed over the metal/via interconnection layers of a chip. In the event that the 32 bit chip function identification code is changed, such as for a new version of a chip, only the mask used in forming the bond pad layer need be changed. The mask for forming the bond pad layer is typically a very low cost glass mask that is much less complicated than metal and via layer masks. These bond pad layer masks often cost twenty or more times less than metal and via layer masks and are much less difficult to modify from design to design. The AP layer mask is the most cost effective mask to write and thus to modify and the links of the AP layer mask—a mask geometry that can be added or removed to connect a standard input to a different signal potential—are easy to design. With previous methods, if chip functionality updates did not otherwise require changes to metal/via masks but the programming of the chip ID function code was made through links selectively set through the metal/via layers, the designer was nonetheless required to update at least one metal/via layer. This step required the design and ordering of a completely new mask despite the fact that the functionality of the chip was not updated through changes to the metal/via layers. With various embodiments of the present invention, in the event that the updates to the chip functionality do not necessitate changes to the metal/via structure, changes need only be made to the mask used in forming the bond pad layer.

Figure 8:
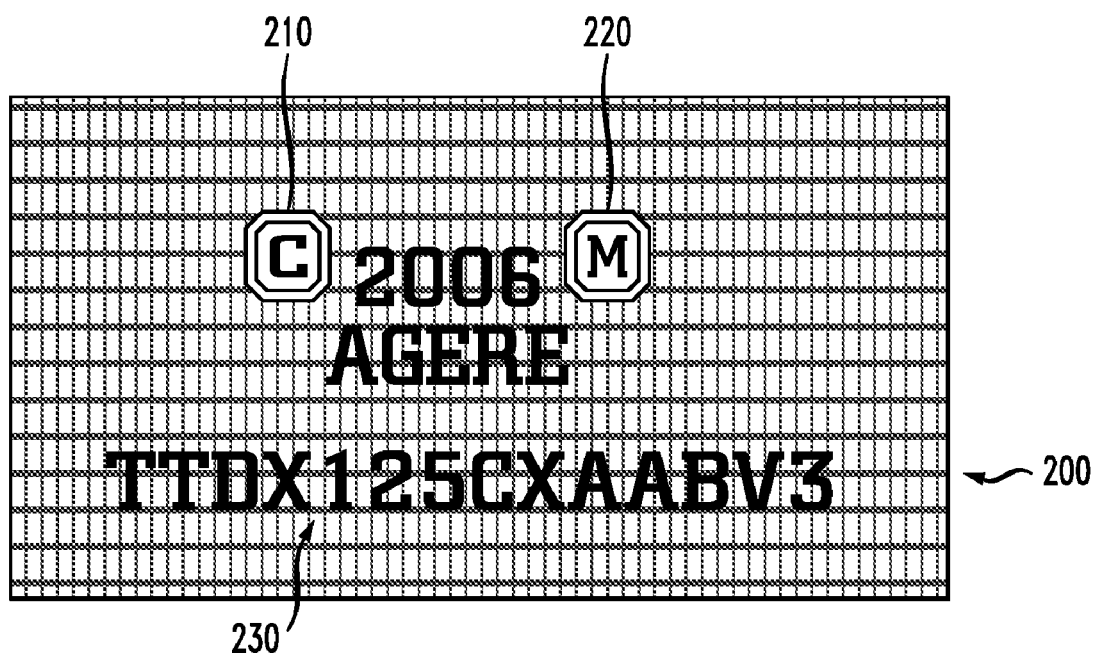
FIG. 8 is a top view of a portion of a chip having human-readable information provided in the top bond pad layer of the chip.

FIG. 8 is a top plan view of another portion of the bond pad (AP) layer, labeled 200. As can be seen in FIG. 8, the AP layer 200 also includes various human-readable features formed in the bond pad layer over the metal/via layers. The human-readable characters are approximately 22 microns by 34 microns in size. These characters are formed by the pad material (e.g., aluminum) used in forming the pads 102, 104, pins B0-B31 and links 106, 108. In the illustrated embodiment, the human-readable information includes a first human readable pattern indicating a product development number 230, a second human readable pattern indicating a copyright notice 210, and/or a third human readable pattern indicating a maskwork registration notice 220. Some or all of this information or other information (e.g., U.S. or foreign patent numbers, trademarks, etc.) can be written into the bond pad layer as desired using the same mask used to form the features in the bond pad layer discussed above in connection with FIGS. 4-7. In prior art methods, this information was written/formed within multiple layers within the metal and via layers, or even at the substrate oxide layer, in an area of the chip void of any circuitry, such as using the Virtuoso® Layout Tool available from Cadence Design Systems Inc. of San Jose, Calif. These feature characters of the prior art are much smaller than those shown in FIG. 8, e.g., approximately 12 microns by 17 microns. The use of the metal and via layers or substrate oxide layer for these features necessitated updating of the expensive masks for these layers if the information changed. As described above, one advantage of providing this information in the AP layer is that only the less expensive AP layer mask need be updated in the event the human-readable information is changed or updated. Further, the larger character and closer proximity to the top layer of the chip makes the AP layer information more readable than prior art counterparts. Still further, all of the human-readable information can be written in a single layer, requiring the use of only one mask. Finally, and importantly, the information written into the AP layer can be formed anywhere on the chip including directly over the chip's circuitry and interconnections because the design is not integrated into the interconnection, or into the substrate oxide layer, saving chip silicon area used in the prior art.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An integrated circuit (IC) structure, comprising:
 a semiconductor substrate having a plurality of memory bits and a plurality of alternating metal layers and via layers thereabove, the memory bits including IC identification information; and
 a bond pad layer formed over a top one of the metal layers, the bond pad layer including a plurality of pins connected to respective ones of the plurality of memory bits through the metal and via layers, at least one first pad connected to a higher voltage power supply rail and at least one second pad connected to a lower voltage power supply rail,
 the bond pad layer having a plurality of circuit segments therein, each of the plurality of circuit segments connecting a respective one of the plurality of pins to either the at least one first pad or the at least one second pad for programming the IC identification information into the memory bit corresponding to that pin.

2. The IC structure of claim 1, wherein each of the plurality of pins is located between and adjacent to the at least one first pad and the at least one second pad.

3. The IC structure of claim 2, wherein the at least one first pad includes a plurality of pads arranged along a first line, the at least one second pad includes a plurality of pads arranged along a second line parallel to the first line, and the plurality of pins are arranged in a third line between and parallel to the first and second lines.

4. The IC structure of claim 1, wherein the bond pad layer is a single layer having pins for programming all of the IC identification information into the memory bits of the semiconductor substrate.

5. The IC structure of claim 1, wherein the metal layers include circuit paths, and the via layers include vias for connecting circuit paths formed in adjacent metal layers, and each of the plurality of pins is coupled to aligned vias in a plurality of via layers forming a straight vertical path between the pin an intermediate metal layer.

6. The IC structure of claim 1, wherein the bond pad layer further comprises a human readable pattern indicating a product development number.

7. The IC structure of claim 1, wherein the bond pad layer further comprises a human readable pattern indicating a copyright notice.

8. The IC structure of claim 1, wherein the bond pad layer further comprises a human readable pattern indicating a maskwork registration notice.

9. The IC structure of claim 1, wherein the bond pad layer further comprises a human readable pattern indicating a number of a patent that covers an IC that includes the IC structure.

10. The IC structure of claim 1,
 wherein the metal layers include circuit paths, and the via layers include vias for connecting circuit paths formed in adjacent metal layers, and
 wherein the bond pad layer further includes at least one human readable pattern showing information relating to the IC structure, wherein said human readable pattern is formed directly over the circuit paths.

11. A method, comprising:
 providing a semiconductor substrate having a plurality of memory bits and a plurality of alternating metal layers and via layers thereabove, the memory bits including integrated circuit (IC) identification information;
 forming a bond pad layer over a top one of the metal layers, the bond pad layer including at least one first pad connected to a higher voltage power supply rail and at least one second pad connected to a lower voltage power supply rail;
 forming, in the bond pad layer, a plurality of pins connected to respective ones of the plurality of memory bits through the metal and via layers; and
 forming a plurality of circuit segments in the bond pad layer, each of the plurality of circuit segments connecting a respective one of the plurality of pins to either the at least one first pad or the at least one second pad, for programming the IC identification information into the memory bit corresponding to that pin.

12. The method of claim 11, further comprising using a single mask to form the plurality of pins, the at least one first pad, the at least one second pad, and the plurality of circuit segments, in the bond pad layer.

13. The method of claim 12, further comprising using the single mask to form a human readable pattern indicating a product development number in the bond pad layer.

14. The method of claim 12, further comprising using the single mask to form a human readable pattern indicating a copyright notice in the bond pad layer.

15. The method of claim 12, further comprising using the single mask to form a human readable pattern indicating a maskwork registration notice in the bond pad layer.

16. The method of claim 12, further comprising using the single mask to form a human readable pattern in the bond pad layer indicating a patent that covers an IC structure.

17. The method of claim 11, wherein the metal layers include circuit paths, and the via layers include vias for connecting circuit paths formed in adjacent metal layers, the method further comprising the step of forming at least one human readable pattern showing information relating to an IC structure, wherein said human readable pattern is formed directly over the circuit paths.

18. The method of claim 11, wherein the step of forming the plurality of pins includes forming each of the plurality of pins between and adjacent to the at least one first pad and the at least one second pad.

19. The method of claim 18, wherein the at least one first pad comprises a plurality of first pads arranged along a first line, and the at least one second pad comprises a plurality of second pads arranged along a second line, and the plurality of pins are arranged in a third line between and adjacent to the first and second lines.

20. The method of claim 11, further comprising programming all of the IC identification information for the memory bits using a single mask.

* * * * *